(12) United States Patent
Yamamoto et al.

(10) Patent No.: US 10,833,166 B2
(45) Date of Patent: Nov. 10, 2020

(54) SEMICONDUCTOR DEVICE INCLUDING AN MIS STRUCTURE

(71) Applicant: ROHM CO., LTD., Kyoto (JP)

(72) Inventors: Kenji Yamamoto, Kyoto (JP); Masatoshi Aketa, Kyoto (JP); Hirokazu Asahara, Kyoto (JP); Takashi Nakamura, Kyoto (JP); Takuji Hosoi, Osaka (JP); Heiji Watanabe, Osaka (JP); Takayoshi Shimura, Osaka (JP); Shuji Azumo, Nirasaki (JP); Yusaku Kashiwagi, Nirasaki (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/316,855

(22) PCT Filed: Jul. 13, 2017

(86) PCT No.: PCT/JP2017/025584
§ 371 (c)(1),
(2) Date: Jan. 10, 2019

(87) PCT Pub. No.: WO2018/012598
PCT Pub. Date: Jan. 18, 2018

(65) Prior Publication Data
US 2019/0355828 A1 Nov. 21, 2019

(30) Foreign Application Priority Data
Jul. 15, 2016 (JP) .............................. 2016-140620

(51) Int. Cl.
*H01L 29/51* (2006.01)
*H01L 29/423* (2006.01)
(Continued)

(52) U.S. Cl.
CPC ........ *H01L 29/517* (2013.01); *H01L 29/4236* (2013.01); *H01L 29/513* (2013.01);
(Continued)

(58) Field of Classification Search
None
See application file for complete search history.

(56) References Cited

U.S. PATENT DOCUMENTS

2010/0065898 A1* 3/2010 Choi ................. H01L 27/10894
257/296
2010/0244192 A1 9/2010 Nakagawa et al.
(Continued)

FOREIGN PATENT DOCUMENTS

JP S63119266 A 5/1988
JP 2002-524860 8/2002
(Continued)

OTHER PUBLICATIONS

Koyama, Masato, et al. "Effect of Film Composition of Nitrogen Incorporated Hafnium Aluminate (HfAlON) Gate Dielectric on Structural Transformation and Electrical Properties through High-Temperature Annealing." Japanese Journal of Applied Physics, vol. 43, No. 4B, 2004, pp. 1788-1794. (Year: 2004).*
(Continued)

*Primary Examiner* — J. E. Schoenholtz
(74) *Attorney, Agent, or Firm* — Gregory M. Howison

(57) ABSTRACT

A semiconductor device has an MIS structure that includes a semiconductor layer, a gate insulating film on the semiconductor layer, and a gate electrode on the gate insulating film. The gate insulating film has a layered structure that includes a base $SiO_2$ layer and a high-k layer on the base $SiO_2$ layer and containing Hf. The gate electrode has a
(Continued)

portion made of a metal material having a work function of higher than 4.6 eV, the portion being in contact with at least the high-k layer.

15 Claims, 14 Drawing Sheets

(51) Int. Cl.
    *H01L 29/78*     (2006.01)
    *H01L 29/16*     (2006.01)
    *H01L 29/20*     (2006.01)
    *H01L 29/24*     (2006.01)

(52) U.S. Cl.
    CPC .......... *H01L 29/78* (2013.01); *H01L 29/7827* (2013.01); *H01L 29/1602* (2013.01); *H01L 29/1608* (2013.01); *H01L 29/2003* (2013.01); *H01L 29/24* (2013.01)

(56) References Cited

U.S. PATENT DOCUMENTS

| | | | |
|---|---|---|---|
| 2012/0132912 A1 | 5/2012 | Suekawa et al. | |
| 2012/0205663 A1* | 8/2012 | Nakamura | H01L 23/291 257/76 |
| 2012/0313149 A1* | 12/2012 | Yin | H01L 29/78 257/288 |
| 2013/0240896 A1* | 9/2013 | Ozaki | H01L 29/7786 257/76 |
| 2013/0306983 A1* | 11/2013 | Nakano | H01L 29/0623 257/76 |
| 2014/0042535 A1* | 2/2014 | Darwish | H01L 29/7395 257/334 |
| 2014/0291775 A1* | 10/2014 | Oka | H01L 29/518 257/411 |
| 2015/0123148 A1* | 5/2015 | Nakano | H01L 21/283 257/77 |
| 2015/0214355 A1* | 7/2015 | Nakano | H01L 29/7805 257/330 |
| 2015/0318372 A1 | 11/2015 | Watanabe et al. | |
| 2016/0087064 A1 | 3/2016 | Ohashi et al. | |
| 2016/0336443 A1* | 11/2016 | Sumida | H01L 29/0847 |
| 2017/0213906 A1* | 7/2017 | Li | H01L 29/7813 |
| 2019/0027598 A1* | 1/2019 | Oyama | H01L 29/7827 |

FOREIGN PATENT DOCUMENTS

| | | |
|---|---|---|
| JP | 2007-243049 A | 9/2007 |
| JP | 2008-537359 A | 9/2008 |
| JP | 2009016530 A | 1/2009 |
| JP | 2012129503 A | 7/2012 |
| JP | 2014110402 A | 6/2014 |
| JP | 2015198185 A | 11/2015 |
| JP | 2016028379 A | 2/2016 |
| JP | 2016066641 A | 4/2016 |
| WO | 2007105413 A1 | 9/2007 |
| WO | 2010050291 A1 | 6/2010 |
| WO | 2014087975 A1 | 12/2014 |

OTHER PUBLICATIONS

Jain, Heena, et al. "Comparision of Wide Band Gap Semiconductors for Power Electronics Applications." 2008 International Conference on Recent Advances in Microwave Theory and Applications, 2008, doi:10.1109/amta.2008.4763184 (Year: 2008).*

Sivasubramani, P., et al. "Effect of Composition on the Thermal Stability of Sputter Deposited Hafnium Aluminate and Nitrided Hafnium Aluminate Dielectrics on Si (100)." Journal of Applied Physics, vol. 101, No. 11, 2007, p. 114108., doi:10.1063/1.2743818. (Year: 2007).*

PCT: International Search Report and Written Opinion of PCT/JP2017/025584; dated Sep. 26, 2017; 15 pages (including English translation for the International Search Report only).

PCT: International Preliminary Report on Patentability of PCT/JP2017/025584; dated Jan. 24, 2019; 19 pages (including English translation).

* cited by examiner

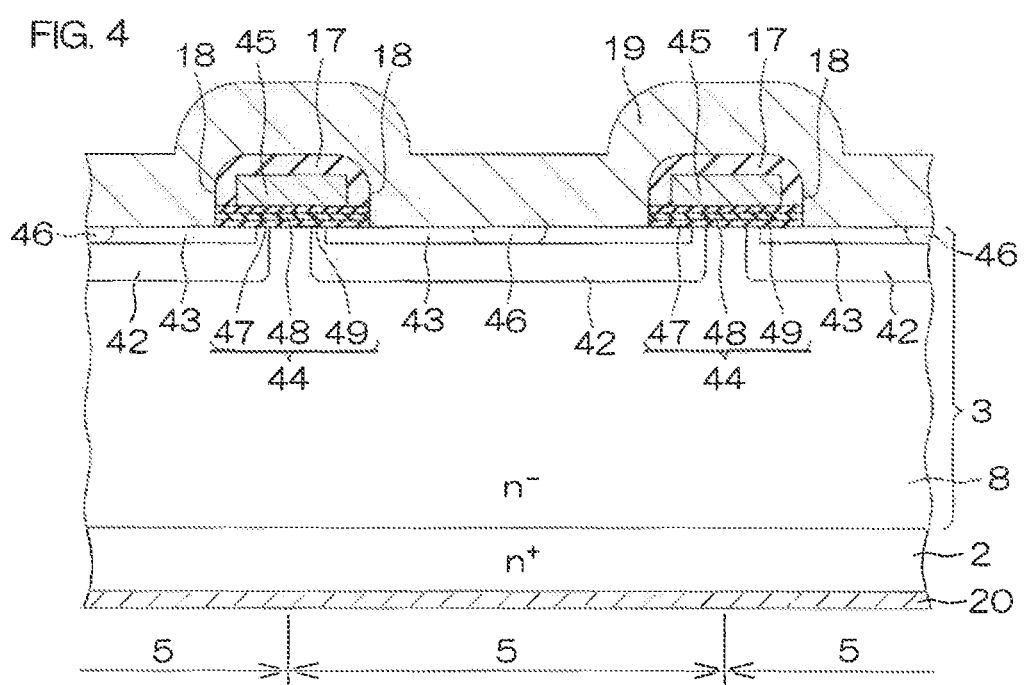

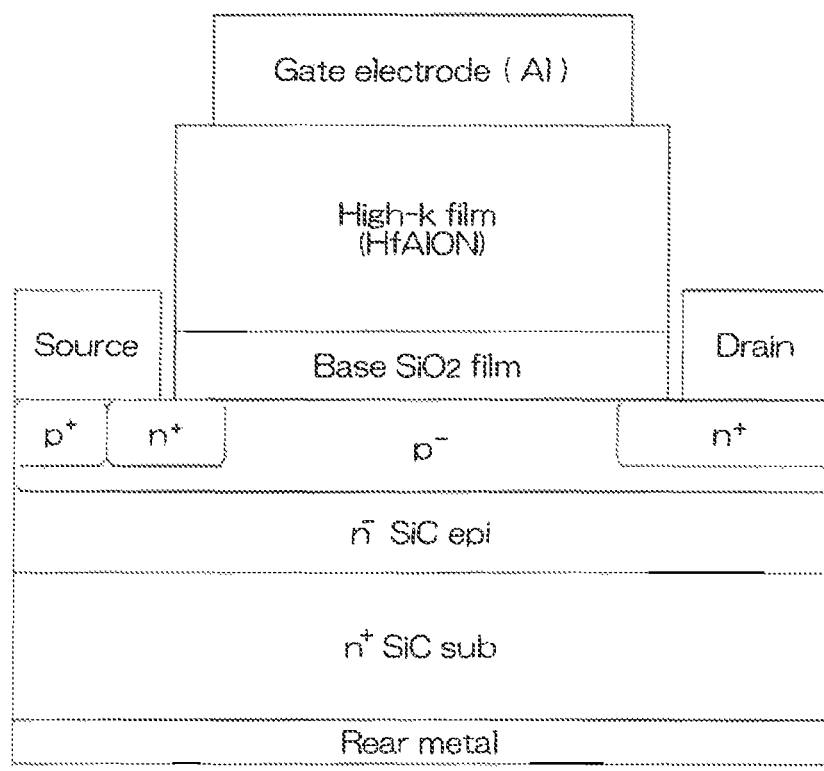
FIG. 5 Reference Structure 1

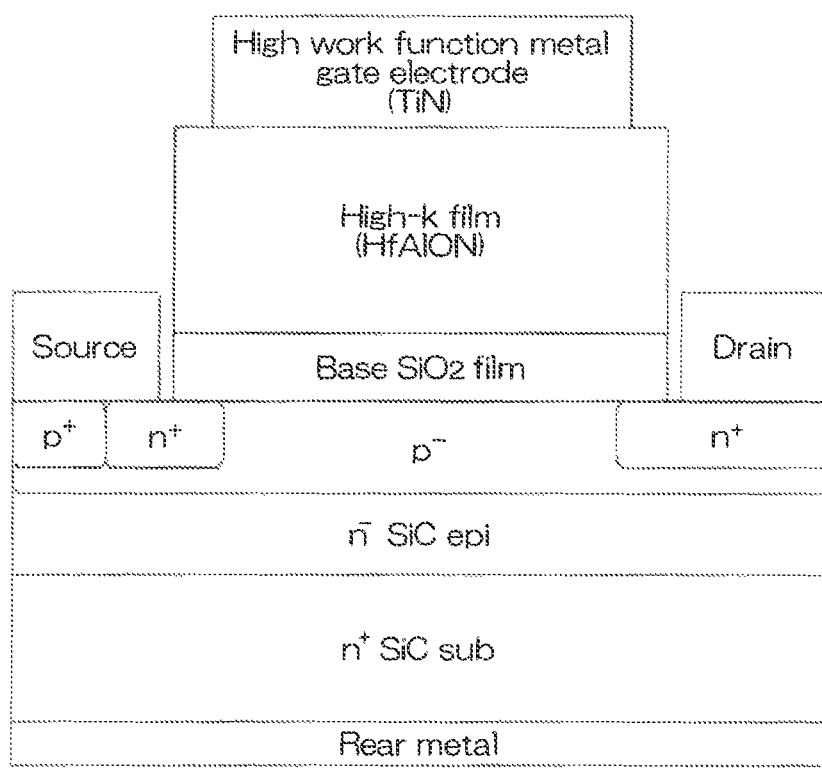
FIG. 6 Verification Structure 1

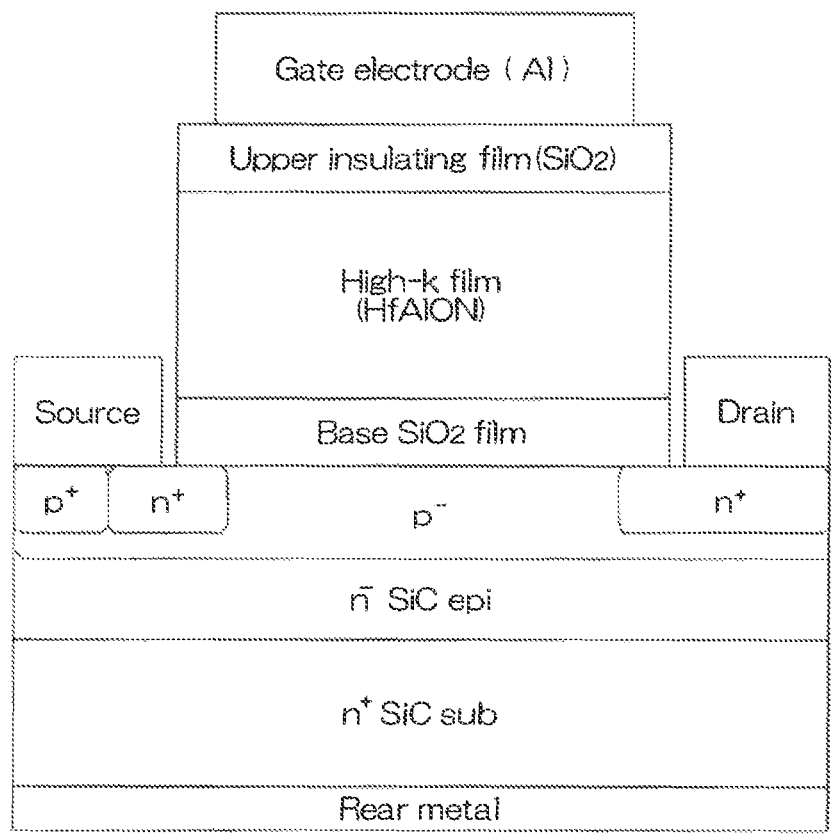
FIG. 7 Verification Structure 2

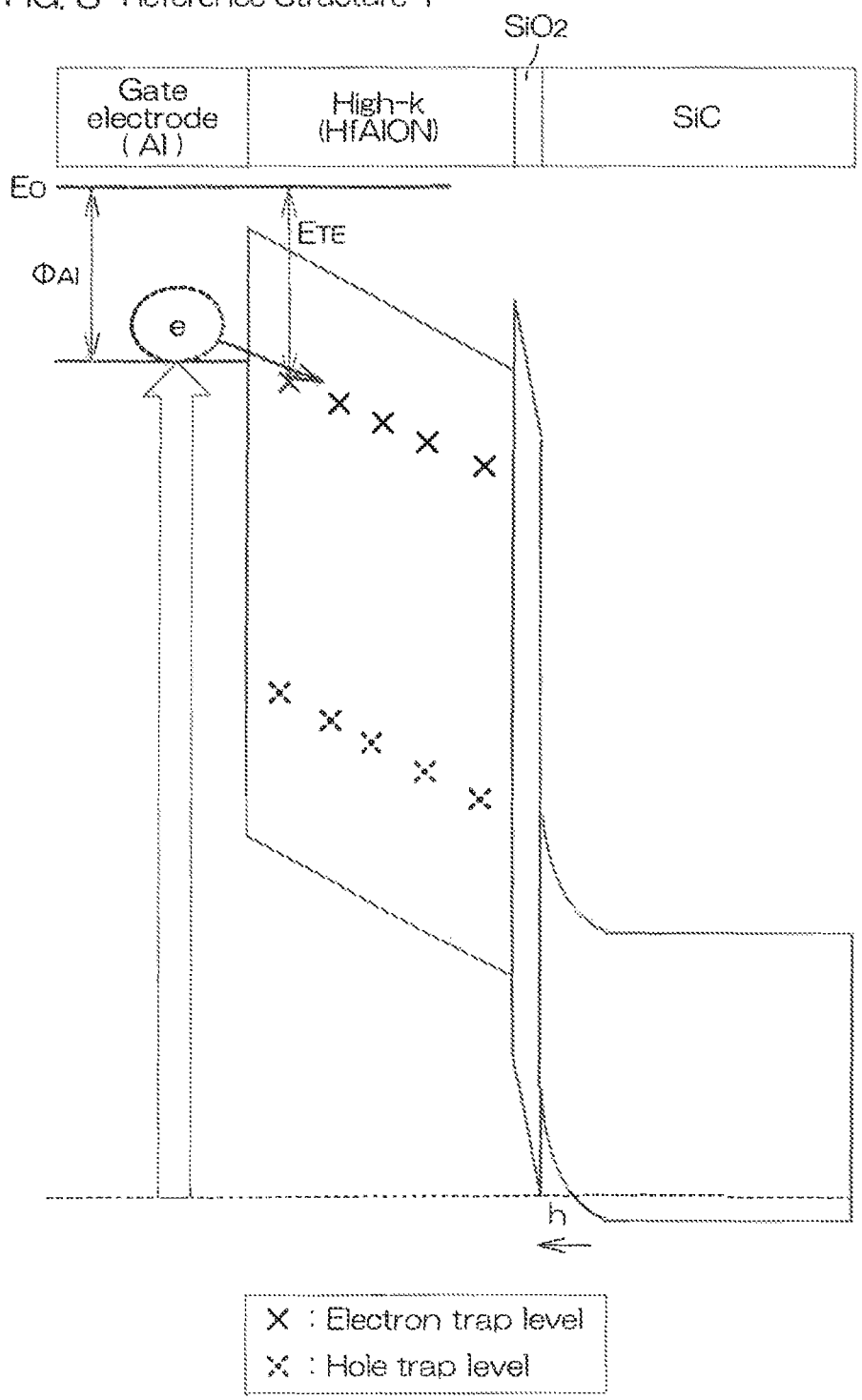

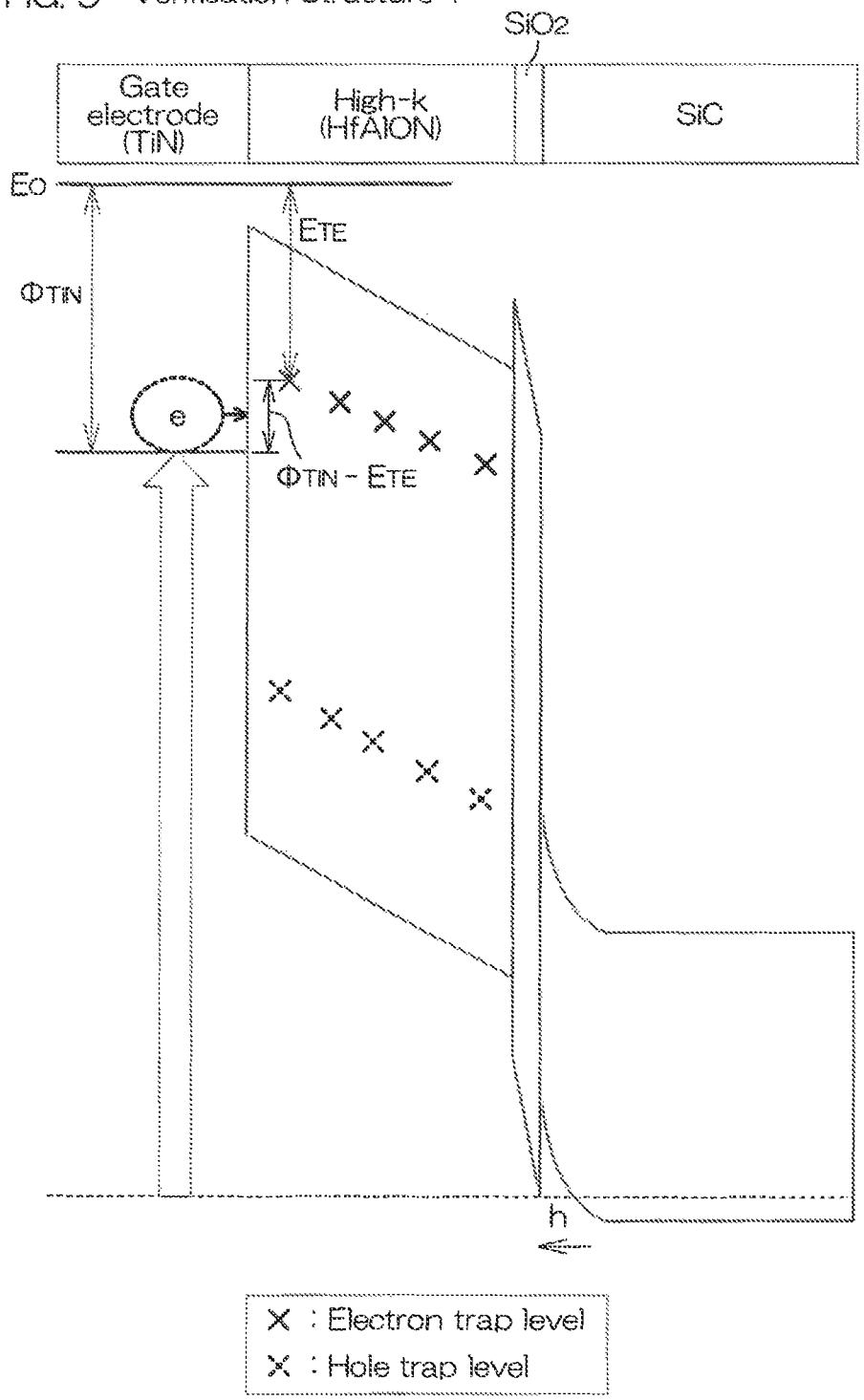
FIG. 9 Verification Structure 1

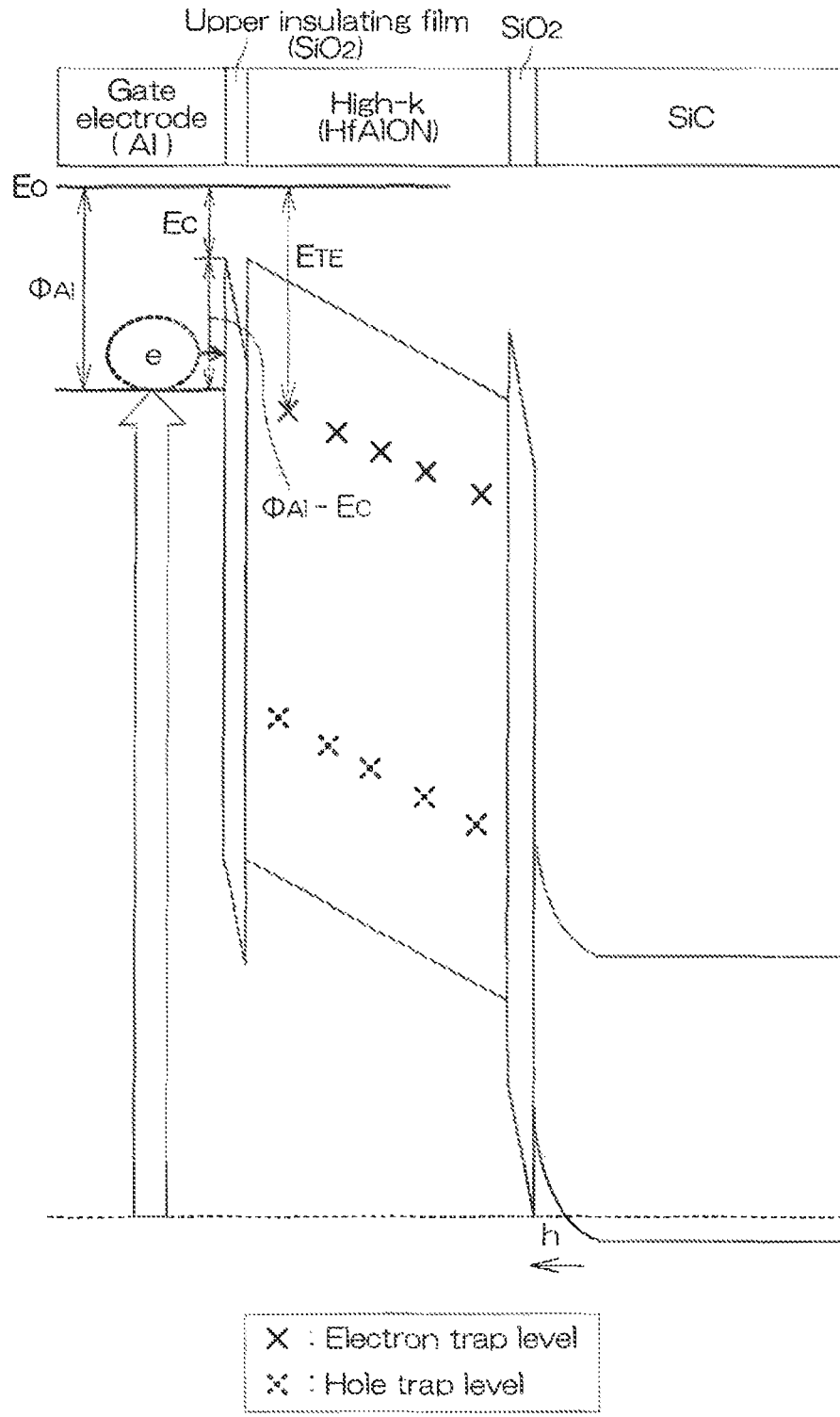

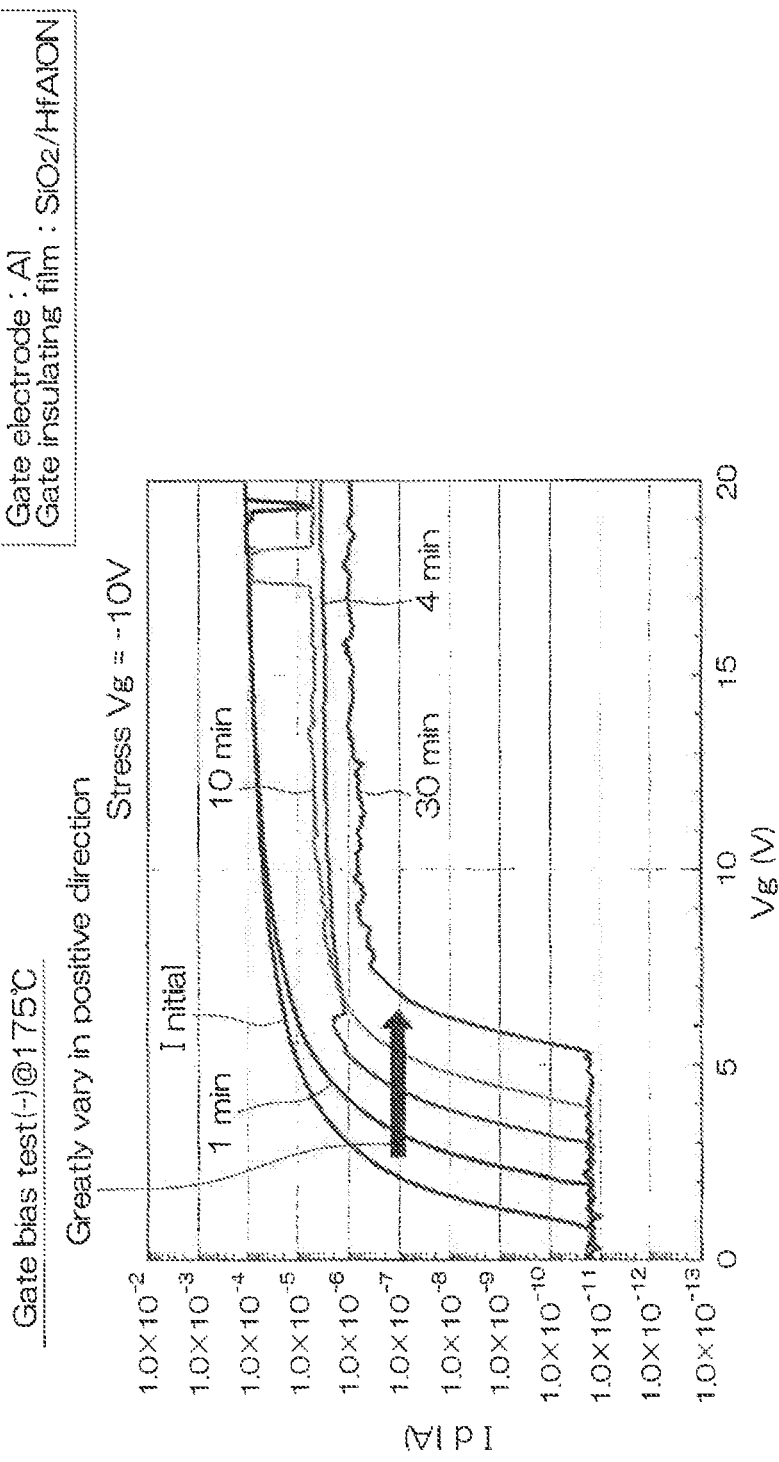
FIG. 11 Threshold variation of Reference Structure 1

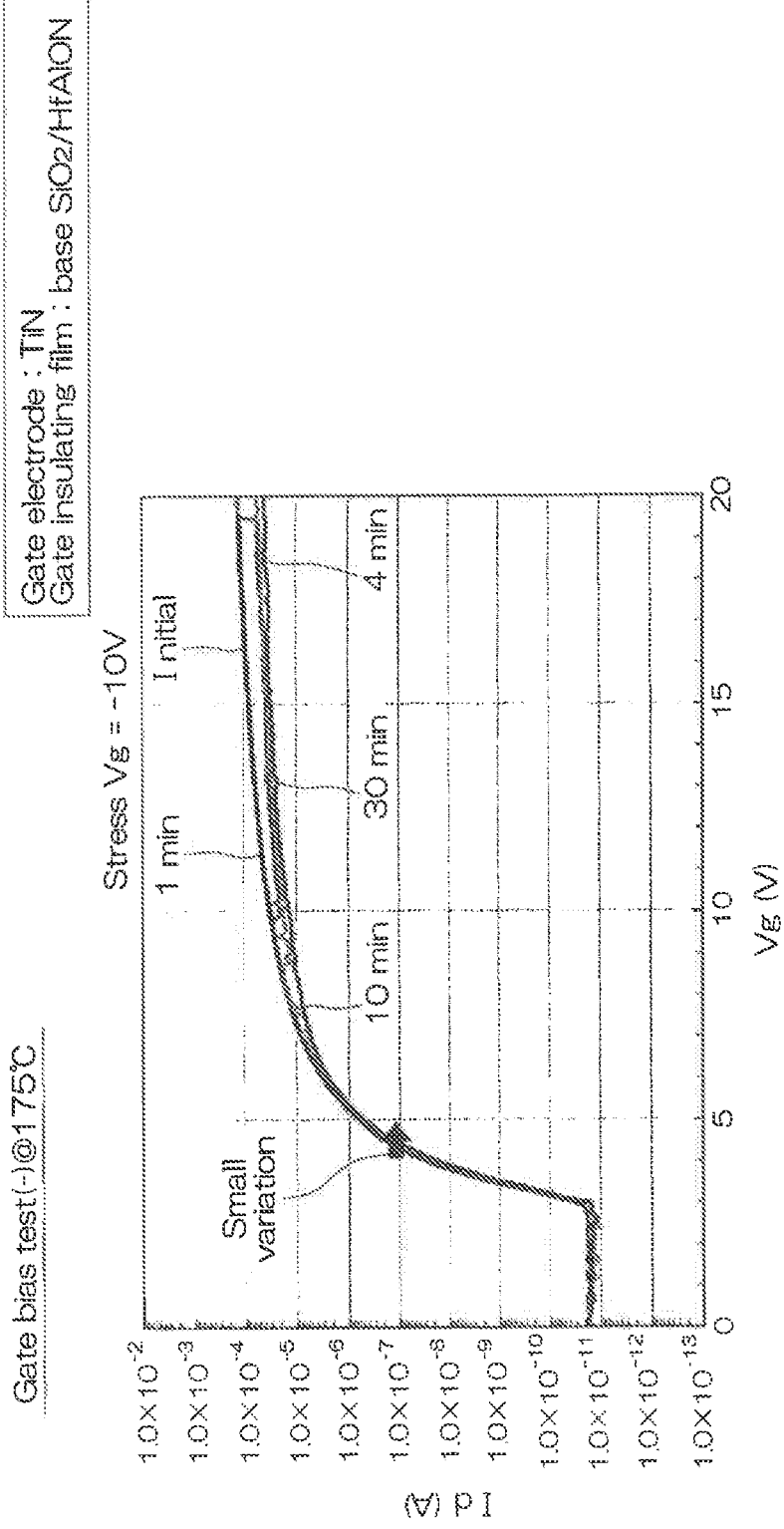
FIG. 12 Threshold variation of Verification Structure 1

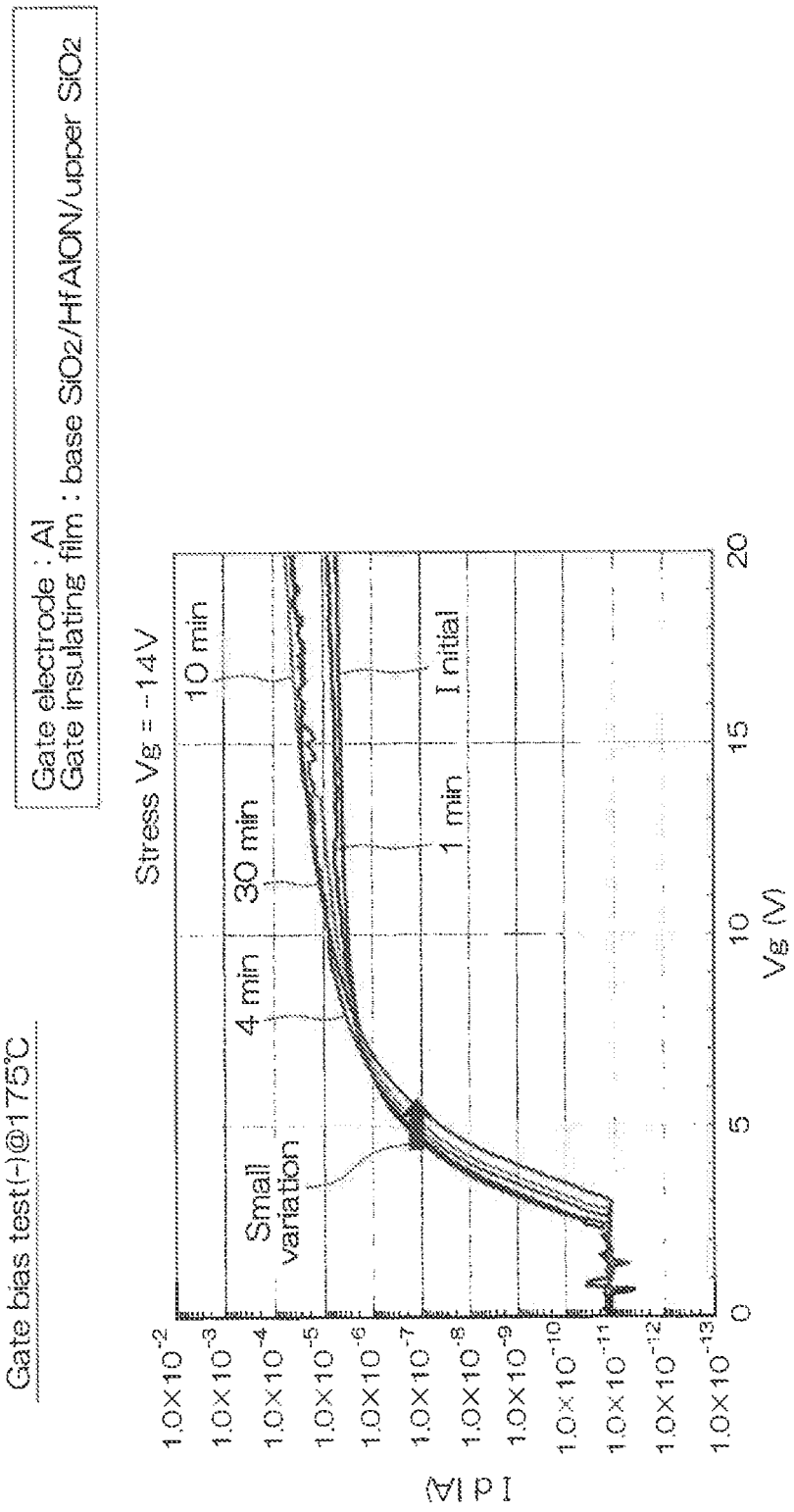
FIG. 13 Threshold variation of Verification Structure 2

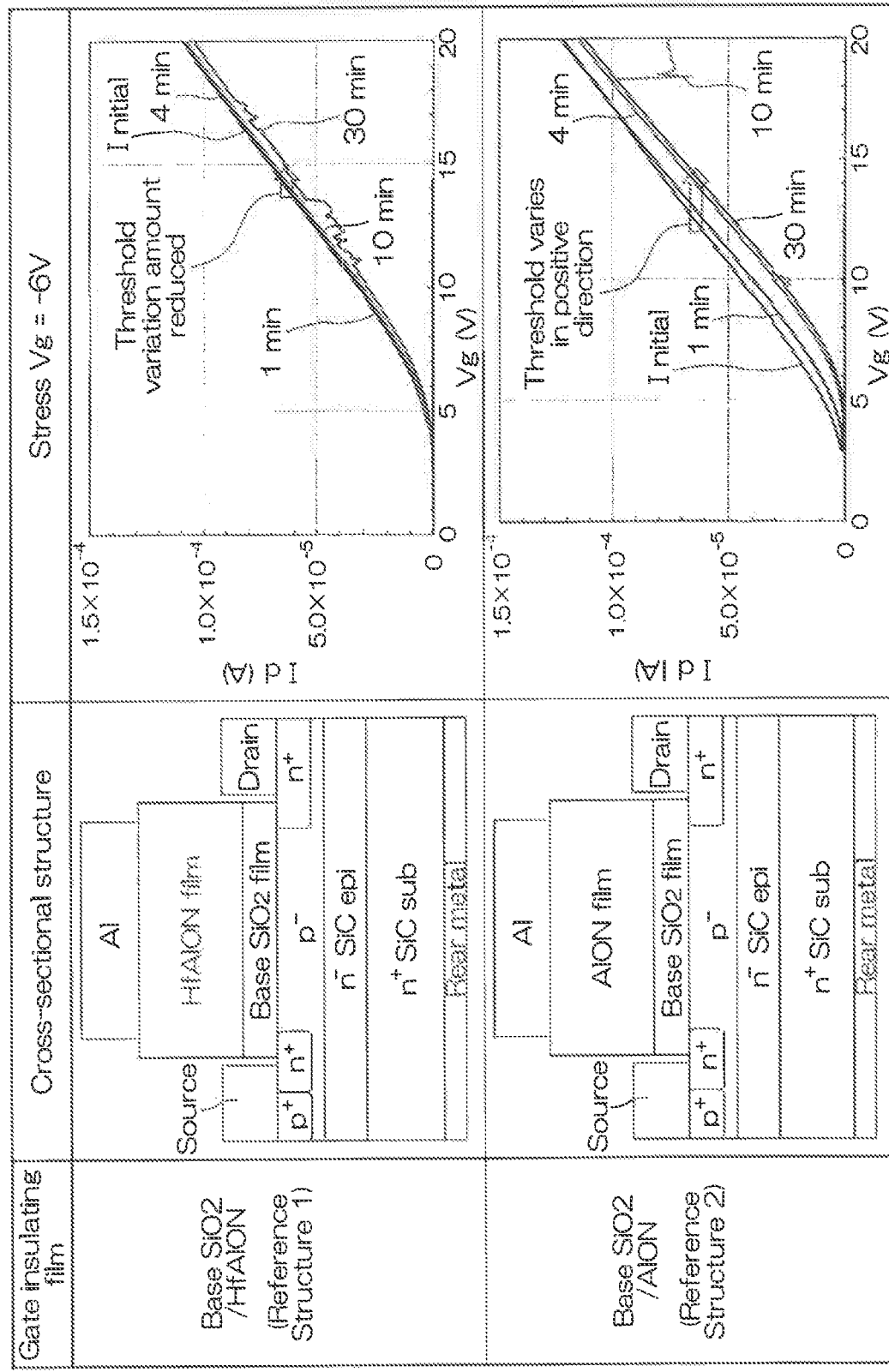
FIG. 14 Gate bias test(−)@175C

SEMICONDUCTOR DEVICE INCLUDING AN MIS STRUCTURE

CROSS-REFERENCE TO RELATED APPLICATIONS

This application is a U.S. National Phase application submitted under 35 U.S.C. § 371 of Patent Cooperation Treaty application serial no. PCT/JP2017/025584, filed Jul. 13, 2017, and entitled SEMICONDUCTOR APPARATUS, which application claims priority to Japanese patent application serial no. JP 2016-140620, filed Jul. 15, 2016, and entitled 半導体装置.

Patent Cooperation Treaty application serial no. PCT/JP2017/025584, published as WO 2018/012598, and Japanese patent application serial no. JP 2016-140620, are incorporated herein by reference.

TECHNICAL FIELD

The present invention relates to a semiconductor device having an MIS structure.

BACKGROUND

A conventionally known semiconductor device having an MIS structure is disclosed in, for example, Patent Literature 1.

The semiconductor device disclosed in Patent Literature 1 includes a semiconductor substrate, at least one nMOS device disposed on one region of the semiconductor substrate, and at least one pMOS device disposed on another region of the semiconductor substrate. The at least one nMOS device has a gate stack in which at least an elemental metal with a low work function which is a work function of lower than 4.2 eV and an in-situ metal capping layer are included. The at least one pMOS device has a gate stack in which at least an elemental metal with a high work function which is a work function of higher than 4.9 eV and a metal capping layer are included.

Patent Literature 2 discloses a semiconductor device having a gate insulating film containing AlON.

CITATION LIST

Patent Literature

Patent Literature 1: Japanese Translation of International Application (Kohyo) No. 2008-537359.
Patent Literature 2: Japanese Patent Application Publication No. 2014-110402.

SUMMARY OF INVENTION

Technical Problem

For example, in some cases, a high-k film (high dielectric constant film) is used as the gate insulating film for a SiC-MISFET. This is because the film thickness can be made relatively thick with a gate capacitance maintained, and deterioration of the gate insulating film can be suppressed.

On the other hand, when a high-k film is used, there may be a problem that electrons trapped in the gate insulating film cause a shift in the flatband voltage $V_{FB}$, and result in a shift in the gate threshold voltage $V_{th}$ accordingly. Among high-k films, the use of an AlON film may reduce the amount of trapped electrons in the gate insulating film. However, there remains a problem of capturing holes in the gate insulating film. Therefore, due to application of a negative voltage to the gate electrode, there may be a shift in the gate threshold voltage $V_{th}$.

A preferred embodiment of the present invention provides a semiconductor device capable of reducing both electron trapping and hole trapping in the gate insulating film and suppressing a shift in the gate threshold voltage $V_{th}$.

Solution to the Problem

A preferred embodiment of the present invention provides a semiconductor device having an MIS structure that includes a semiconductor layer having a front surface and a rear surface, a gate insulating film formed on the front surface side in the semiconductor layer, and a gate electrode on the gate insulating film. The gate insulating film has a layered structure that includes a base $SiO_2$ layer and a high-k layer on the base $SiO_2$ layer and containing Hf. The gate electrode has a portion made of a metal material having a work function of higher than 4.6 eV, the portion being in contact with at least the high-k layer.

The electron trap level $E_{TE}$ in a high-k material containing Hf with respect to the vacuum energy level $E_0$ is, for example, $E_{TE}$=about 3.5 eV to 4.5 eV. In this case, if the work function $\Phi$ of a metal material in contact with the high-k material is equal to or lower than the electron trap level $E_{TE}$ ($\Phi \leq E_{TE}$), the amount of electrons injected into the high-k material when a voltage is applied to the metal material tends to increase. Therefore, due to the injected electrons, the flatband voltage $V_{FB}$ may shift, thereby increasing the amount of shift in the gate threshold voltage $V_{th}$.

In contrast, with the above-described configuration, the gate electrode has the portion that is made of a metal material having a work function $\Phi$ of higher than 4.6 eV where the portion contacts with at least the high-k layer, and thus an energy barrier occurs between the gate electrode and the high-k layer. The height of the energy barrier corresponds to, for example, the difference ($\Phi - E_{TE}$) between the work function $\Phi$ of the metal material and the electron trap level $E_{TE}$ of the high-k layer. Because of this energy barrier, injection of electrons into the gate insulating film when a positive gate voltage is applied can be suppressed. In addition, with the above-described configuration, injection of holes into the gate insulating film when a negative gate voltage is applied can be suppressed. As described above, both electron trapping and hole trapping in the gate insulating film can be reduced, and thus the amount of shift in the gate threshold voltage $V_{th}$ can be satisfactorily reduced.

Another preferred embodiment of the present invention provides a semiconductor device having an MIS structure that includes a semiconductor layer having a front surface and a rear surface, a gate insulating film formed on the front surface side in the semiconductor layer, and a gate electrode on the gate insulating film. The gate insulating film has a layered structure that includes a base $SiO_2$ layer, a high-k layer on the base $SiO_2$ layer and containing Hf, and an upper insulating layer between the high-k layer and the gate electrode. The upper insulating layer is made of a material having a difference of lower than 4 eV between a lowest energy Ec in the conduction band and a vacuum energy level.

With this configuration, the upper insulating layer is interposed between the gate electrode and the high-k layer. Thus, even if the work function $\Phi$ of the gate electrode is equal to or lower than the electron trap level $E_{TE}$ in the high-k layer ($\Phi \leq E_{TE}$), the energy barrier between the gate electrode and the upper insulating layer can be used as a barrier, thereby suppressing injection of electrons into the gate insulating film. In addition, with the above-described configuration, injection of holes into the gate insulating film when a negative gate voltage is applied can be suppressed. As described above, both electron trapping and hole trapping in the gate insulating film can be reduced, and thus the amount of shift in the gate threshold voltage $V_{th}$ can be satisfactorily reduced.

Still another preferred embodiment of the present invention provides a semiconductor device having an MIS structure that includes a semiconductor layer having a front surface and a rear surface, a gate insulating film formed on the front surface side in the semiconductor layer, and a gate electrode on the gate insulating film. The gate insulating film has a layered structure that includes a base $SiO_2$ layer and a high-k layer on the base $SiO_2$ layer and containing Hf. The gate electrode has a portion made of Mo, Cu, Au, Ni, Pt or TiN, the portion being in contact with at least the high-k layer.

The work functions of Mo and TiN are $\Phi_{Mo}$=about 4.6 eV and $\Phi_{TiN}$=about 5.1 eV, respectively. Therefore, this makes it possible to cause, for example, an energy barrier of 0.6 eV or higher ($\Phi_{Mo}-E_{TE}$), or an energy barrier of 1.1 eV or higher ($\Phi_{TiN}-E_{TE}$) between the gate electrode and the high-k layer. Because of this energy barrier, injection of electrons into the gate insulating film when a positive gate voltage is applied can be suppressed. In addition, with the above-described configuration, injection of holes into the gate insulating film when a negative gate voltage is applied can be prevented. As described above, both electron trapping and hole trapping in the gate insulating film can be reduced, and thus the amount of shift in the gate threshold voltage $V_{th}$ can be satisfactorily reduced.

Still another predetermined embodiment of the present invention provides a semiconductor device having an MIS structure that includes a semiconductor layer having a front surface and a rear surface, a gate insulating film formed on the front surface side in the semiconductor layer, and a gate electrode on the gate insulating film. A variation rate of a post-test threshold voltage after a negative stress voltage of a predetermined magnitude is applied to the gate electrode for 30 minutes or longer to an initial threshold voltage of the gate electrode is within 20%.

In other words, even after a negative stress voltage is applied for 30 minutes or longer, the amount of shift in the gate threshold voltage $V_{th}$ can fall within 20%.

BRIEF DESCRIPTION OF THE DRAWINGS

FIG. 4 is a cross-sectional view of a semiconductor device according to another preferred embodiment of the present invention.

FIG. 5 is a schematic configuration diagram of Reference Structure 1 that was used to measure the variation rate of a gate threshold voltage $V_{th}$.

FIG. 6 is a schematic configuration diagram of Verification Structure 1 that was used to measure the variation rate of the gate threshold voltage $V_{th}$.

FIG. 7 is a schematic configuration diagram of Verification Structure 2 that was used to measure the variation rate of the gate threshold voltage $V_{th}$.

FIG. 8 is an energy band diagram of Reference Structure 1.

FIG. 9 is an energy band diagram of Verification Structure 1.

FIG. 10 is an energy band diagram of Verification Structure 2.

FIG. 11 shows the variation rate of the gate threshold voltage $V_{th}$ in Reference Structure 1.

FIG. 12 shows the variation rate of the gate threshold voltage $V_{th}$ in Verification Structure 1.

FIG. 13 shows the variation rate of the gate threshold voltage $V_{th}$ in Verification Structure 2.

FIG. 14 shows the variation rates of the gate threshold voltage $V_{th}$ in Reference Structure 1 and Reference Structure 2.

DETAILED DESCRIPTION

Preferred embodiments of the present invention shall hereinafter be described in detail with reference to the attached drawings.

Figure 1:
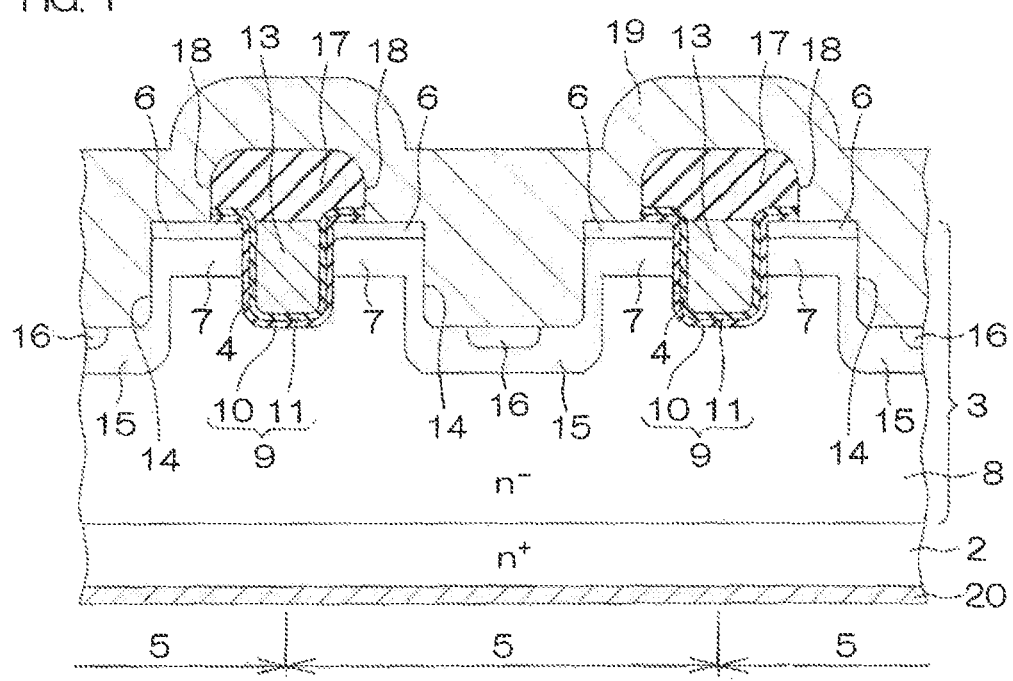
FIG. 1 is a cross-sectional view of a semiconductor device according to a preferred embodiment of the present invention.

FIG. 1 is a cross-sectional view of a semiconductor device 1 according to a preferred embodiment of the present invention.

The semiconductor device 1 includes a substrate 2 made of $n^+$ type (for example, with a concentration of $1 \times 10^{19}$ to $5 \times 10^{19}$ cm$^{-3}$) SiC and a semiconductor layer (epitaxial layer) 3 that is made of $n^-$ type (for example, with a concentration of $1 \times 10^{15}$ to $1 \times 10^{16}$ cm$^{-3}$) SiC formed on the substrate 2. The substrate 2 and the semiconductor layer 3 may be made from a wide bandgap semiconductor other than SiC (for example, GaN, $Ga_2O_3$, diamond, etc.). The substrate 2 and the semiconductor layer 3 function as a drain of the semiconductor device 1. As the n type impurity, phosphorus (P) or arsenic (As), etc., is contained. A similar n type impurity is contained in n type semiconductor regions mentioned below.

In the semiconductor layer 3, gate trenches 4 are formed by being dug down from a front surface of the semiconductor layer 3 toward the substrate 2. The gate trenches 4 are formed, for example, in lattice form or stripe form. In the semiconductor layer 3, a plurality of unit cells 5, partitioned by the gate trenches 4, are thereby formed.

At peripheries of the gate trenches 4 in the semiconductor layer 3, $n^+$ type source regions 6 and p type body regions 7 (for example, with a concentration of $1 \times 10^{17}$ to $5 \times 10^{17}$ cm$^{-3}$) are formed in that order from the side closer to the front surface of the semiconductor layer 3. As the p type impurity, for example, boron (B) or aluminum (Al), etc., is contained in the body regions 7. A similar p type impurity is contained in p type semiconductor regions mentioned below.

The source region 6 is formed on a front surface portion of each unit cell 5 so as to be exposed on the front surface of the semiconductor layer 3 and so as to define an upper portion (a portion) of a side surface of the gate trench 4. On the other hand, the body region 7 is formed so as to contact the source region 6 at the substrate 2 side (rear surface side of the semiconductor layer 3) with respect to the source region 6 and so as to define a lower portion (a portion) of the side surface of the gate trench 4.

A region of the semiconductor layer 3 at the substrate 2 side with respect to the body region 7 is an n⁻ type drain region 8 that is maintained as it is in a state after epitaxial growth. The drain region 8 contacts the body region 7 at the substrate 2 side with respect to the body region 7 and defines a bottom surface of the gate trench 4.

On an inner surface of the gate trench 4, a gate insulating film 9 is formed so as to cover the entire inner surface. The gate insulating film 9 includes a base $SiO_2$ film 10 and a high-k film 11 that are successively laminated from the inner surface side of the gate trench 4. In the present preferred embodiment, the base $SiO_2$ film 10 is formed so as to contact the entire inner surface of the gate trench 4, and the high-k film 11 is laminated on the base $SiO_2$ film 10 so as to cover the entire region of the base $SiO_2$ film 10. It is noted that the two-layer structure of these films may be formed across the entire inner surface of the gate trench 4 as in the present preferred embodiment or may be formed selectively at channel portions of the inner surface of the gate trench 4 (the portions of the side surface of the gate trench 4 at which the body regions 7 are exposed). In this case, other portions of the gate insulating film 9 may be arranged as a single layer film constituted of $SiO_2$.

Also in the present preferred embodiment, the gate insulating film 9 may be formed to cover an opening end side edge portion of the gate trench 4. The opening end side edge portion of the gate trench 4 defines an included angle between the front surface of the semiconductor layer 3 and the side surface of the gate trench 4. Portions in the respective vicinities of the front surface of the semiconductor layer 3 in the source region 6 and the side surface of the gate trench 4 are thus covered by the gate insulating film 9.

The gate insulating film 9 has a thickness of, for example, 55 nm to 150 nm. The preferable ranges of thickness of the respective films are not less than 5 nm (more preferably, 5 nm to 20 nm) for the base $SiO_2$ film 10, and not less than 10 nm (more preferably, 10 nm to 200 nm) for the high-k film 11.

In the present preferred embodiment, the base $SiO_2$ film 10 is formed, for example, by thermal oxidation of the semiconductor layer 3. By arranging the film in contact with the semiconductor layer 3 (especially, the channel portion) as a thermal oxide film, transistor characteristics that are excellent in comparison to a deposited film, such as a CVD film, can be expressed.

The high-k film 11 is a film in which Hf (hafnium) atoms are dispersed in the film, and is preferably a HfAlON film in which Hf is added to an AlON film. In this case, the Hf composition (Hf/(Hf+Al)) of the high-k film 11 made of HfAlON is, for example, 30 to 70%, preferably 40 to 60%. Further, the N amount of the high-k film 11 is, for example, 10% or less, preferably 5% or less. Furthermore, the high-k film 11 is preferably amorphous or microcrystalline. If the high-k film 11 has such a structure, crystal grain boundaries in the gate insulating film 9 can be decreased and the gate leakage current can thus be reduced.

Such a gate insulating film 9 can be formed, for example, by successively laminating the base $SiO_2$ film 10 and the high-k film 11 after the gate trench 4 is formed in the semiconductor layer 3. The base $SiO_2$ film 10 can be formed, for example, by a thermal oxidation method (for example, at 1100° C. to 1300° C.). Further, the high-k film 11 can be formed by depositing the respective atoms, for example, by an ALD (atomic layer deposition) method, a CVD method, or a PVD (physical vapor deposition) method, etc.

It is noted that PDA (post deposition annealing) at, for example, 700° C. to 1000° C. may be performed after the high-k film 11 is formed. Thereby, shifting of the flatband voltage $V_{FB}$ can be satisfactorily suppressed.

In the gate trench 4, a gate electrode 13 is embedded at the inner side of the gate insulating film 9. A trench gate type MIS structure is thereby arranged in which the source region 6, the body region 7, and the drain region 8 that define the inner surface of the gate trench 4 face the gate electrode 13 across the gate insulating film 9.

The gate electrode 13 is made of a metal material having a work function $\Phi$ of higher than 4.6 eV. For example, the gate electrode 13 may be made of Mo ($\Phi_{Mo}$=4.6 eV), Cu ($\Phi_{Cu}$=4.6 eV), Au ($\Phi_{Au}$=5.1 eV), Ni ($\Phi_{Ni}$=5.2 eV), Pt ($\Phi_{Pt}$=5.6 eV), TiN ($\Phi_{TiN}$=5.1 eV) or the like. The gate electrode 13 may be made of a metal material having a work function $\Phi$ of higher than 4.6 eV in its entirety. Alternatively, in the gate electrode 13, only a portion in contact with the high-k film 11 may selectively be made of a metal material with $\Phi$>4.6 eV and a layer made of a metal material not having a work function $\Phi$ of the same range may be laminated on the portion. For example, the gate electrode 13 may include a first metal layer made of TiN disposed on the high-k film 11 so as to contact the high-k film 11 and a second metal layer made of Al on the first metal layer.

At a central portion of each unit cell 5, a source trench 14 is formed by being dug down from the front surface of the semiconductor layer 3 toward the substrate 2. The source trench 14 penetrates through the source region 6 and the body region 7 from the front surface of the semiconductor layer 3 and reaches the drain region 8. In the present preferred embodiment, the source trench 14 is formed to the same depth as the gate trench 4.

In the semiconductor layer 3, a p type region 15 is formed at a periphery of the source trench 14. In a lower region of the body region 7, the p type region 15 is exposed at an inner surface of the source trench 14 so as to be continuous (so as to be connected) to the body region 7. That is, at the lower region, the p type region 15 is interposed between the drain region 8 and the inner surface of the source trench 14. The p type region 15 is thereby exposed at a bottom surface and a bottom side edge portion of the source trench 14.

Also, in the p type region 15, a p⁺ type body contact region 16 is formed at the bottom surface of the source trench 14. In the present preferred embodiment, the body contact region 16 is disposed at a central portion separated to the inner side by an interval from the side surface of the source trench 14.

On the semiconductor layer 3, an interlayer insulating film 17 is formed so as to cover the gate electrodes 13. In regions except for the interlayer insulating film 17, contact holes 18 of a larger diameter than the source trench 14 are formed. The entirety of the source trench 14 (that is, the entire inner surface of the source trench 14) and a portion of the source region 6 of each unit cell 5 are thus exposed inside the contact hole 18.

A source electrode 19 is formed on the interlayer insulating film 17. The source electrode 19 enters via the respective contact holes 18 into the source trenches 14 of all unit cells 5 collectively. The source electrode 19 contacts the body contact region 16, the p type region 15, the body region 7, and the source region 6 successively from the bottom side of the source trench 14. That is, the source electrode 19 is a wiring common to all unit cells 5. In the present preferred embodiment, the source electrode 19 has a structure in which a Ti/TiN layer and an Al layer are laminated successively from the side in contact with the semiconductor layer 3.

On the rear surface of the substrate 2, a drain electrode 20 is formed so as to cover the entire rear surface. The drain electrode 20 is an electrode common to all unit cells 5. As the drain electrode 20, for example, a layered structure (Ti/Ni/Au/Ag) can be employed in which Ti, Ni, Au, and Ag are laminated successively from the substrate 2 side.

Figure 2:
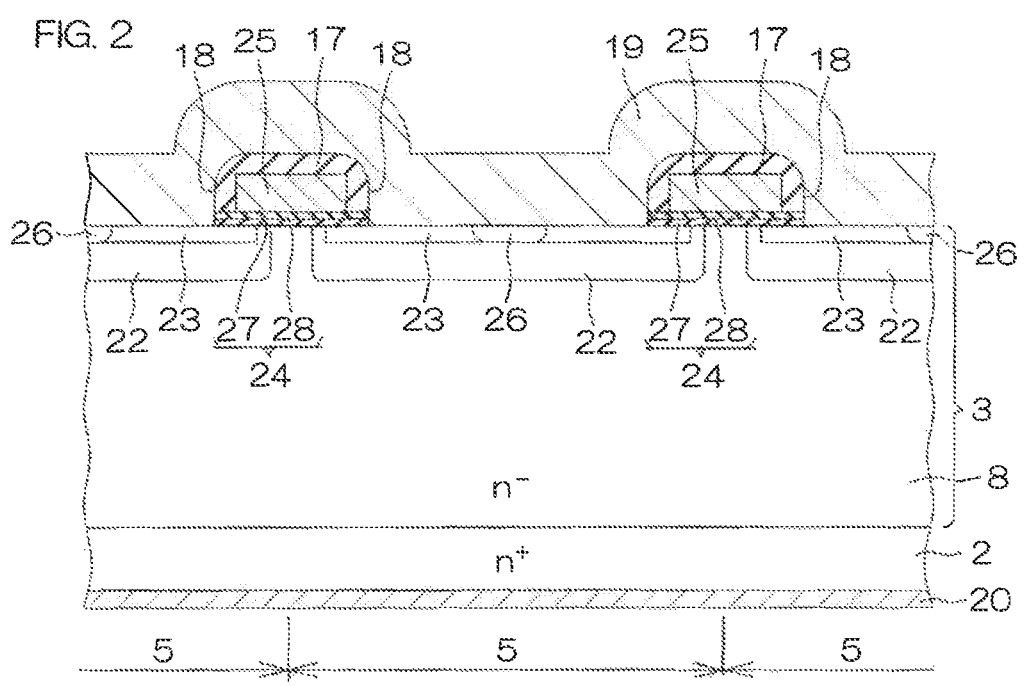
FIG. 2 is a cross-sectional view of a semiconductor device according to another preferred embodiment of the present invention.

FIG. 2 is a cross-sectional view of a semiconductor device 21 according to another preferred embodiment of the present invention. In FIG. 2, portions corresponding to respective portions shown in FIG. 1 in the description above are provided with the same reference symbols, and description thereof will be omitted.

With the preferred embodiment shown in FIG. 1, the MIS structure is arranged as a trench gate type with the gate electrode 13 facing the source region 6, the body region 7, and the drain region 8, which define the inner surface of the gate trench 4, across the gate insulating film 9.

In contrast, the MIS structure of the semiconductor device 21 according to the present preferred embodiment is arranged as a planar gate type.

The planar gate type MIS structure includes a p type body region 22 formed selectively in a front surface portion of the semiconductor layer 3, an $n^+$ type source region 23 formed selectively in the body region 22, a gate insulating film 24 formed on the front surface of the semiconductor layer 3, a gate electrode 25 facing the body region 22, exposed at the front surface of the semiconductor layer 3, across the gate insulating film 24, and a $p^+$ type body contact region 26 penetrating through the source region 23 from the front surface of the semiconductor layer 3 and having a deepest portion that reaches the body region 22.

As with the gate insulating film 9 in the preferred embodiment of FIG. 1, the gate insulating film 24 of the semiconductor device 21 also includes a base $SiO_2$ film 27 and a high-k film 28 that are successively laminated from the front surface side of the semiconductor layer 3. The gate electrode 25 and the high-k film 28 may be made of the same material as the gate electrode 13 and the high-k film 11 in the preferred embodiment of FIG. 1, respectively.

Figure 3:
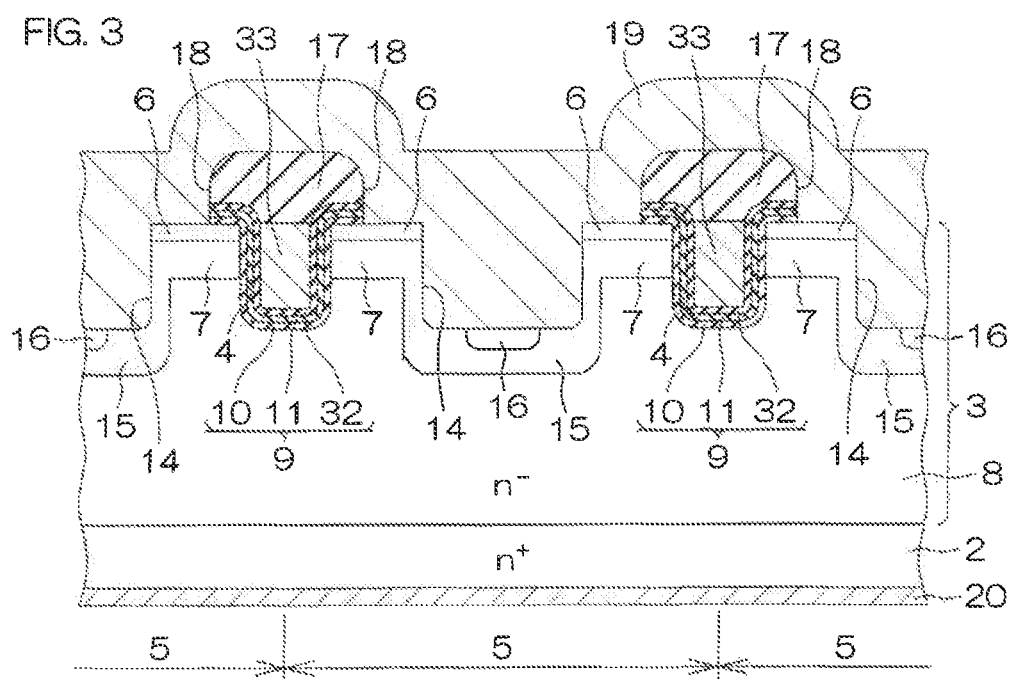
FIG. 3 is a cross-sectional view of a semiconductor device according to another preferred embodiment of the present invention.

FIG. 3 is a cross-sectional view of a semiconductor device 31 according to another preferred embodiment of the present invention. In FIG. 3, portions corresponding to respective portions shown in FIG. 1 in the description above are provided with the same reference symbols, and description thereof will be omitted.

In the preferred embodiment of FIG. 1, the gate insulating film 9 includes the base $SiO_2$ film 10 and the high-k film 11 that successively laminated from the inner surface side of the gate trench 4. On the other hand, the semiconductor device 31 according to the present preferred embodiment further includes an upper insulating film 32 on the high-k film 11.

The upper insulating film 32 is made of an insulating material in which the lowest energy Ec of the conduction band is lower than 4 eV from the vacuum energy level $E_0$. For example, the upper insulating film 32 is made of $SiO_2$ (Ec=0.9 eV), or the like. Further, the upper insulating film 32 may be directly formed on the high-k film 11 so as to contact the high-k film 11, or a layer made of an insulating material not having the lowest energy Ec of the same range may be interposed between the upper insulating film 32 and the high-k film 11. Furthermore, the thickness of the upper insulating film 32 may be 5 nm or more. Also, the upper insulating film 32 can be formed, for example, by the CVD method.

Further, in the present preferred embodiment, a gate electrode 33 does not have to be made of a metal material having a work function Φ of higher than 4.6 eV, unlike the gate electrode 13 described above. In other words, the work function Φ of the gate electrode 33 may be 4.6 eV or less. For example, the gate electrode 33 is made of Al ($\Phi_{Al}$=4.1 eV) or the like.

FIG. 4 is a cross-sectional view of a semiconductor device 41 according to another preferred embodiment of the present invention. In FIG. 4, portions corresponding to respective portions shown in FIG. 1 to FIG. 3 in the description above are provided with the same reference symbols, and description thereof will be omitted.

With the preferred embodiment shown in FIG. 3, the MIS structure is arranged as a trench gate type with the gate electrode 33 facing the source region 6, the body region 7, and the drain region 8, which define the inner surface of the gate trench 4, across the gate insulating film 9.

In contrast, the MIS structure of the semiconductor device 41 according to the present preferred embodiment is arranged as a planar gate type.

The planar gate type MIS structure includes a p type body region 42 formed selectively in a front surface portion of the semiconductor layer 3, an n+ type source region 43 formed selectively in the body region 42, a gate insulating film 44 formed on the front surface of the semiconductor layer 3, a gate electrode 45 facing the body region 42, exposed at the front surface of the semiconductor layer 3, across the gate insulating film 44, and a p+ type body contact region 46 penetrating through the source region 43 from the front surface of the semiconductor layer 3 and having a deepest portion that reaches the body region 42.

As with the gate insulating film 9 in the preferred embodiment of FIG. 3, the gate insulating film 44 of the semiconductor device 41 also includes a base $SiO_2$ film 47, a high-k film 48, and an upper insulating film 49 that are successively laminated from the front surface side of the semiconductor layer 3. The gate electrode 45 and the high-k film 48 may be made of the same material as the gate electrode 33 and the high-k film 11 in the preferred embodiment of FIG. 3, respectively.

Next, referring to FIG. 5 to FIG. 13, it is described in detail that the semiconductor devices 1, 21, 31, 41 according to the above-described preferred embodiments can suppress a shift in the gate threshold voltage $V_{th}$.

First, FIG. 5 to FIG. 7 show Reference Structure 1, Verification Structure 1, and Verification Structure 2 that were used to measure the variation rate (shift rate) of the gate threshold voltage $V_{th}$, respectively.

Specifically, in Reference Structure 1 of FIG. 5, the gate insulating film has the two-layer structure of an $SiO_2$ film and a high-k film (HfAlON film), and the gate electrode made of Al ($\Phi_{Al}$=4.1 eV) is provided on the HfAlON film.

Verification Structure 1 of FIG. 6 is for verifying the variation rate of the gate threshold voltage $V_{th}$ in the structure of the semiconductor devices 1 and 21. In Verification Structure 1, the gate insulating film has the two-layer structure of an $SiO_2$ film and a high-k film (HfAlON film), and the gate electrode made of TiN ($\Phi_{TiN}$=5.1 eV) is provided on the HfAlON film.

Verification Structure 2 of FIG. 7 is for verifying the variation rate of the gate threshold voltage $V_{th}$ in the structure of the semiconductor devices 31 and 41. In Verification Structure 2, the gate insulating film has the three-layer structure of an $SiO_2$ film, a high-k film (HfAlON film), and an $SiO_2$ film, and the gate electrode made of Al ($\Phi_{Al}$=4.1 eV) is provided on the upper $SiO_2$ film.

Next, FIG. 8 to FIG. 10 are energy band diagrams of Reference Structure 1, Verification Structure 1, and Verification Structure 2, respectively. With reference to these energy band diagrams, the degree of electron injection from the gate electrode to the high-k film in each structure will be described.

As shown in FIG. 8, in Reference Structure 1, the electron trap level $E_{TE}$ of the high-k film with respect to the vacuum energy level $E_0$ is about 3.5 eV to 4.5 eV, whereas the work function $\Phi_{Al}$ of the gate electrode (Al) is 4.1 eV. That is, the work function $\Phi_{Al}$ of the gate electrode is almost equal to or lower than the electron trap level $E_{TE}$ of the high-k film. Therefore, when a positive voltage is applied to the gate electrode, electrons are easily injected into the high-k film.

On the other hand, as shown in FIG. 9, in Verification Structure 1 based on the semiconductor devices 1 and 21, the work function $\Phi_{TiN}$ of the gate electrode is higher than the electron trap level $E_{TE}$ (=3.5 eV to 4.5 eV) of the high-k film ($\Phi_{TiN}$=5.1 eV), and a predetermined energy barrier ($\Phi_{TiN}$–$E_{TE}$) thus occurs between the gate electrode and the high-k film. Because of this energy barrier, injection of electrons into the high-k film when a positive gate voltage is applied can be suppressed.

Further, as shown in FIG. 10, in Verification Structure 2 based on the semiconductor devices 31 and 41, although the work function $\Phi_{Al}$ of the gate electrode is almost equal to or lower than the electron trap level $E_{TE}$ of the high-k film, the upper insulating film made of $SiO_2$ is provided. Therefore, the energy barrier ($\Phi_{Al}$–Ec) between the gate electrode ($\Phi_{Al}$=4.1 eV) and the upper insulating film (Ec=3.5 eV) can be used as a barrier, thereby suppressing injection of electrons into the gate insulating film.

As described above, FIG. 8 to FIG. 10 show that Verification Structures 1 and 2 can reduce the injection amount of electrons as compared with Reference Structure 1 from the viewpoint of the energy band diagram, whereas FIG. 11 to FIG. 13 show the variation rate of the gate threshold voltage $V_{th}$ in each structure, which indicates the reduced injection amount of electrons and the effect of the reduced injection amount of holes not shown in FIG. 8 to FIG. 10.

In order to compare the variation rates of the gate threshold voltage $V_{th}$, the following gate bias test was carried out for each structure. That is, in a temperature environment of 175° C., a positive gate voltage was applied to the gate electrode so that a drain current flows between the source and the drain, and then a negative stress voltage (Vg=–10 V) was applied to the gate electrode for a predetermined time. Specifically, after an initial drain current flows, the stress voltage was applied for 1 minute, and then the application time of the stress voltage was increased to 3 minutes, 6 minutes, and 20 minutes. A positive gate voltage was applied to the gate electrode during the application of each stress voltage, and the drain current and the gate rising voltage at that time were measured and graphed. The graphs are shown in FIG. 11 to FIG. 13. In FIG. 11 to FIG. 13, "Initial" represents the initial drain current, and "1 min," "4 min," "10 min," and "30 min" each indicate the total application time of the stress voltage. For example, the graph of "10 min" shows the drain current after the stress voltage is applied in three separate time periods of 1 minute, 3 minutes, and 6 minutes in total for 10 minutes.

As shown in FIG. 11, in Reference Structure 1, when a stress voltage of Vg=–10 V was applied for 30 minutes or longer, the post-test threshold voltage (30 min) varied (shifted) in the positive direction by 260% or more with respect to the initial threshold voltage (Initial) of the gate electrode. Considering that the rising voltage (not shown) of the leakage current on the negative side in Reference Structure 1 was –15 V, it is found that the shift is due to the application of a stress voltage of –10 V, which is close to the rising voltage, causes many holes to be injected into the high-k film and trapped in the high-k film.

In contrast, as shown in FIG. 12 and FIG. 13, in Verification Structures 1 and 2, even when a stress voltage of Vg=–10 V was applied for 30 minutes or longer, the variation rate of the post-test threshold voltage (30 min) fell within 20% with respect to the initial threshold voltage (Initial) of the gate electrode. Considering that the rising voltages (not shown) of the leakage current on the negative side of Verification Structures 1 and 2 were –20 V and –30 V, respectively, it is found that even when a stress voltage of –10 V was applied, holes were hardly injected into the high-k film.

From the above results, it is observed that the semiconductor devices 1, 21, 31, and 41 according to the above-described preferred embodiments can suppress a shift in the gate threshold voltage $V_{th}$.

Next, with reference to FIG. 14, it is described how the amount of shift in the gate threshold voltage $V_{th}$ can be reduced by using the high-k film containing Hf Specifically, the amounts of shift in the gate threshold voltage $V_{th}$ in Reference Structure 1 and Reference Structure 2 in which the high-k film (HfAlON film) in Reference Structure 1 is replaced with an AlON film were compared with each other. The gate voltage tests performed on both structures were similar to those shown in FIG. 11 to FIG. 13.

As a result of the tests, it is found that Reference Structure 1 using the HfAlON film can suppress a shift in the gate threshold voltage $V_{th}$ better than Reference Structure 2 using the AlON film as the high-k film. In other words, taking into consideration the results shown in FIG. 11 to FIG. 13, it is observed that the combination of (1) the high-k film containing Hf and (2-1) the gate electrode having a work function of 4.6 eV or more or (2-2) the upper insulating film between the gate electrode and the high-k film makes it possible to reduce both electron trapping and hole trapping in the gate insulating film, thereby satisfactorily suppressing a shift in the gate threshold voltage $V_{th}$.

Although preferred embodiments of the present invention have been described above, the present invention may be implemented in yet other modes.

For example, in the semiconductor devices 1, 21, 31, and 41, an arrangement with which the conductivity types of the respective semiconductor portions are inverted may be adopted. For example, in the semiconductor device 1, a p type portion may be of an n type and an n type portion may be of a p type.

Also, although with the above-described preferred embodiments, a MISFET of the trench gate type or the planar gate type was taken as an example of the present invention, the present invention can also be applied to an MIS transistor structure, such as a CMOSFET (Complementary Metal Oxide Semiconductor Field Effect Transistor), etc.

Besides the above, various design modifications may be made within the scope of the matters described in the claims.

The present application corresponds to Japanese Patent Application No. 2016-140620 filed in the Japan Patent Office on Jul. 15, 2016, and the entire disclosure of this application is incorporated herein by reference.

REFERENCE SIGNS LIST

1 Semiconductor device
2 Substrate
3 Semiconductor layer (epitaxial layer)

4 Gate trench
9 Gate insulating film
10 Base SiO$_2$ film
11 High-k film
13 Gate electrode
21 Semiconductor device
24 Gate insulating film
25 Gate electrode
27 Base SiO$_2$ film
28 High-k film
31 Semiconductor device
32 Upper insulating film
33 Gate electrode
41 Semiconductor device
44 Gate insulating film
45 Gate electrode
47 Base SiO$_2$ film
48 High-k film
49 Upper insulating film

The invention claimed is:

1. A semiconductor device comprising an MIS structure including:
    a semiconductor layer having a front surface and a rear surface, the semiconductor layer made from a material selected from a group consisting of SiC, GaN, Ga$_2$O$_3$, and diamond;
    a gate trench formed from the front surface of the semiconductor layer;
    a gate insulating film formed so as to cover a side surface and a bottom surface of the gate trench; and
    a gate electrode formed on the gate insulating film so as to be embedded in the gate trench;
    a source region of a first conductivity type formed on a front surface side in the semiconductor layer so as to contact the side surface of the gate trench;
    a body region of a second conductivity type formed closer to a rear surface side in the semiconductor layer than the source region;
    a drain region of a first conductivity type formed closer to the rear surface side in the semiconductor layer than the body region;
    an interlayer insulating film formed so as to cover an upper portion of the gate electrode;
    a source trench formed at a position away from the gate trench so as to penetrate the source region and the body region and formed from the front surface of the semiconductor layer;
    a source electrode electrically connected to the source region such that the source electrode is embedded inside the source trench;
    a drain electrode electrically connected to the drain region;
    wherein the gate insulating film has a layered structure that includes a base Si0$_2$ layer and a high-k layer on the base SiO$_2$ layer and containing Hf, and an upper insulating layer between the high-k layer and the gate electrode,
    the gate electrode has a portion made of a metal material having a work function of equal to or lower than an electron trap level in the high-k layer, the portion being in contact with at least the upper insulating layer and the gate electrode is opposed to the body region via the base SiO$_2$ layer, the high-k layer and the upper insulating layer;
    the upper insulating layer is made of a material having a difference of lower than 4 eV between a lowest energy Ec in the conduction band and a vacuum energy level,
    the interlayer insulating film has a contact hole wider than the source trench; and
    a part of an upper surface of the source region is exposed from the contact hole and is in contact with the source electrode.

2. The semiconductor device according to claim 1, wherein the high-k layer includes an HfAlON layer.

3. The semiconductor device according to claim 2, wherein the HfAlON layer has an Hf composition (Hf/(Hf+Al)) of 30% to 70%.

4. The semiconductor device according to claim 2, wherein the HfAlON layer has an N amount of 10% or less.

5. The semiconductor device according to claim 2, wherein the HfAlON layer has a thickness of 10 nm to 200 nm.

6. The semiconductor device according to claim 2, wherein the HfAlON layer is selected from a group consisting of an amorphous HfAlON layer and a microcrystalline HfAlON layer.

7. The semiconductor device according to claim 1, wherein the base SiO$_2$ layer has a thickness of at least 5 nm.

8. The semiconductor device according to claim 1, wherein a second conductivity type region is formed around the source trench so as to be continuous to the body region.

9. A semiconductor device comprising an MIS structure including:
    a semiconductor layer having a front surface and a rear surface, the semiconductor layer made of SiC;
    a gate insulating film formed on the front surface of the semiconductor layer; and
    a gate electrode formed on the gate insulating film,
    a source region of a first conductivity type formed on a front surface side in the semiconductor layer;
    a body region of a second conductivity type formed on the front surface side in the semiconductor layer such that the body region is in contact with the source region;
    a drain region of a first conductivity type formed on the front surface side in the semiconductor layer such that the body region is in contact with the body region,
    wherein the gate insulating film has a layered structure that includes a base SiO$_2$ layer, a high-k layer on the base SiO2 layer and containing Hf, and an upper insulating layer between the high-k layer and the gate electrode,
    the gate electrode has a portion made of a metal material having a work function of equal to or lower than an electron trap level in the high-k layer, the portion being in contact with at least the upper insulating layer and the gate electrode is opposed to the body region via the base SiO2 layer, the high-k layer and the upper insulating layer,
    the upper insulating layer is made of a material having a difference of lower than 4 eV between a lowest energy Ec in the conduction band and a vacuum energy level, and
    the high-k layer includes an HfAlON layer having an Hf composition (Hf/(Hf+Al)) of 30% to 70%.

10. A semiconductor device comprising an MIS structure including:
    a semiconductor layer having a front surface and a rear surface, the semiconductor layer made of SiC;
    a gate insulating film formed on the front surface of the semiconductor layer; and
    a gate electrode formed on the gate insulating film,
    a source region of a first conductivity type formed on a front surface side in the semiconductor layer;

a body region of a second conductivity type formed on the front surface side in the semiconductor layer such that the body region is in contact with the source region;

a drain region of a first conductivity type formed on the front surface side in the semiconductor layer such that the body region is in contact with the body region, wherein the gate insulating film has a layered structure that includes a base $SiO_2$ layer, a high-k layer on the base $SiO_2$ layer and containing Hf, and an upper insulating layer between the high-k layer and the gate electrode, the gate electrode has a portion made of a metal material having a work function of equal to or lower than an electron trap level in the high-k layer, the portion being in contact with at least the upper insulating layer and the gate electrode is opposed to the body region via the base $SiO_2$ layer, the high-k layer and the upper insulating layer, the upper insulating layer is made of a material having a difference of lower than 4 eV between a lowest energy Ec in the conduction band and a vacuum energy level, and the high-k layer includes an HfAlON layer having an N amount of 10% or less.

11. A semiconductor device comprising an MIS structure including:

a semiconductor layer having a front surface and a rear surface, the semiconductor layer made of SiC;

a gate insulating film formed on the front surface of the semiconductor layer; and a gate electrode formed on the gate insulating film, a source region of a first conductivity type formed on a front surface side in the semiconductor layer;

a body region of a second conductivity type formed on the front surface side in the semiconductor layer such that the body region is in contact with the source region;

a drain region of a first conductivity type formed on the front surface side in the semiconductor layer such that the body region is in contact with the body region, wherein the gate insulating film has a layered structure that includes a base $SiO_2$ layer, a high-k layer on the base $SiO_2$ layer and containing Hf, and an upper insulating layer between the high-k layer and the gate electrode, the gate electrode has a portion made of a metal material having a work function of equal to or lower than an electron trap level in the high-k layer, the portion being in contact with at least the upper insulating layer and the gate electrode is opposed to the body region via the base $SiO_2$ layer, the high-k layer and the upper insulating layer, the upper insulating layer is made of a material having a difference of lower than 4 eV between a lowest energy Ec in the conduction band and a vacuum energy level, and the high-k layer includes an HfAlON layer which is selected from a group consisting of an amorphous HfAlON layer and a microcrystalline HfAlON layer.

12. The semiconductor device according to claim 1, wherein the upper insulating layer is made of $SiO_2$ and has a thickness of 5 nm or more.

13. The semiconductor device according to claim 9, wherein the upper insulating layer is made of $SiO_2$ and has a thickness of 5 nm or more.

14. The semiconductor device according to claim 10, wherein the upper insulating layer is made of $SiO_2$ and has a thickness of 5 nm or more.

15. The semiconductor device according to claim 11, wherein the upper insulating layer is made of $SiO_2$ and has a thickness of 5 nm or more.

* * * * *